(12) United States Patent
Chan

(10) Patent No.: US 6,879,201 B1
(45) Date of Patent: Apr. 12, 2005

(54) GLITCHLESS PULSE GENERATOR

(75) Inventor: Siuki Chan, Cupertino, CA (US)

(73) Assignee: Xilinx, Inc., San Jose, CA (US)

(*) Notice: Subject to any disclaimer, the term of this patent is extended or adjusted under 35 U.S.C. 154(b) by 222 days.

(21) Appl. No.: 10/114,524

(22) Filed: Apr. 1, 2002

(51) Int. Cl.$^7$ ................................................ H03K 3/00
(52) U.S. Cl. ........................ 327/291; 327/298; 327/175; 327/176; 377/124
(58) Field of Search ................................ 377/29, 49, 51, 377/52, 70, 77, 122, 124; 327/291, 294, 298, 299, 227, 172–176

(56) References Cited

U.S. PATENT DOCUMENTS

| | | | | |
|---|---|---|---|---|
| 3,768,026 A | * | 10/1973 | Pezzutti | 327/227 |
| 4,087,813 A | * | 5/1978 | Minner et al. | 341/145 |
| 4,338,529 A | * | 7/1982 | Fujibayashi | 327/100 |
| 5,365,119 A | * | 11/1994 | Kivari | 327/115 |
| 5,481,214 A | * | 1/1996 | Tamaki et al. | 327/172 |
| 5,517,638 A | | 5/1996 | Szczepanek | |
| 5,768,325 A | * | 6/1998 | Yamamoto et al. | 375/372 |
| 5,935,944 A | * | 8/1999 | LaHann | 514/64 |
| 6,204,695 B1 | | 3/2001 | Alfke et al. | |

FOREIGN PATENT DOCUMENTS

JP  2-290322 A  11/1990

OTHER PUBLICATIONS

Peter H. Alfke, "Trouble–Free Switching Between Clocks", published First Quarter 1997 in Xilinx Publication XCell, available from Xilinx, Inc., 2100 Logic Drive, San Jose, California 95124.

* cited by examiner

*Primary Examiner*—Timothy P. Callahan
*Assistant Examiner*—An T. Luu
(74) *Attorney, Agent, or Firm*—Julie A. Stephenson; Edel M. Young; Justin Liu

(57) ABSTRACT

A glitchless T length pulse is generated by coupling a trigger signal and the latched output of a counter. The trigger signal initiates the start of the T length pulse, and the latched output of the counter initiates the end of the T length pulse after counting up a duration of T from a number of clock cycles of a clock signal. Latching the output of the counter prior to terminating the T length pulse eliminates glitches. Accuracy of the count determining the length of the T length pulse may be increased by latching the trigger signal with the clock signal to generated a synchronized trigger signal, and using the synchronized trigger signal to initiate the T length pulse.

35 Claims, 6 Drawing Sheets

GLITCHLESS PULSE GENERATOR

FIELD OF THE INVENTION

The present invention relates to programmable logic devices, and more particularly, to a system and method for generating glitchless pulses.

BACKGROUND OF THE INVENTION

New silicon chips undergo many tests throughout the development and testing cycle. For example, design testing is done early in the development cycle of a product and debugging is done during production of the product. One test performed on silicon chips involves the internal circuitry delay (i.e. the propagation delay) through structures on the chip. Internal circuitry delay is tested by providing a pulse of a known length to an oscillating device, such as an inverter ring, implemented on the chip, and then counting the number of state value toggles by the oscillating device that occur during the length of the pulse. The number of state value toggles during the pulse is inversely proportional to the internal circuitry delay. It is preferable to implement all of these functions on a single chip.

Conventionally, a multi-function tester is used to perform many of the tests required for a chip, including testing the internal circuitry delay. FIG. 1 is a block diagram of a multi-function tester 110 and a chip 120 undergoing testing. Multi-function tester 110 provides a pulse P of known duration to chip 120. A counter (not shown) implemented on chip 120 counts toggles of an inverter ring (not shown) implemented on chip 120 and provides this number back to multi-function tester 110 as a count C. Multi-function testers such as that multi-function tester 110 are quite expensive and are typically in heavy use. As a result, obtaining time to test a chip for internal circuitry delay requires scheduling time for use of the multi-function tester, as well as the initial cost of obtaining the multi-function tester.

The internal circuitry delay may also be tested directly without resorting to a multi-function tester. FIG. 2 is a block diagram of a conventional pulse generation circuit 200 used for such a direct test. Pulse generation circuit 200 includes a 5-bit binary counter 210, an NAND gate 220, and a pulse generator 230. A transition to a logic "1" value of a trigger signal TRIGGER sets an initial value of binary counter 210 (e.g. 5) and causes binary counter 210 to count clock pulses of clock signal FFCLK, decrementing the count down to a particular value (e.g. 0). Count data lines 212 carry the binary count of the binary counter 210. For example, when a 5-bit binary counter is set to a value of 5, count data lines carry a binary "00101" value.

NAND gate 220 has a plurality of input terminal invertedly coupled to count data lines 212. As a result, a decrement of the count of binary counter 210 to 0 will cause all input terminals of NAND gate 220 to receive logic "1" values, thereby causing a logic "0" value of count indicator signal C to appear at the output terminal of NAND gate 220. By uninverting one or more of the input terminals for a particular application, counter 210 may count down to a number other than 0. In this way, NAND gate 220 is programmed to indicate when a particular count of binary counter 210 has been reached by causing count indicator signal C to transition to a logic "0" value. A similar conventional method uses an OR gate in place of HAND gate 220.

Pulse generator 230 provides a pulse signal P beginning from the time a logic "1" value of trigger signal TRIGGER is received. Pulse generator 230 maintains logic "1" pulse signal P as long as a logic "1" count indicator signal is received from NAND gate 220. Pulse signal P transitions to a logic "0" upon completion of the count of binary counter 210. The result is a pulse signal P that has a width indicated by the particular count of binary counter 210. Glitches occur in the value of count indicator C due to timing differences in the receipt of values on count data lines. For example, in transitioning from a count value of 2 (e.g. "00010") to a count value of 1 (e.g. "00001"), the least significant bit may transition to a logic "1" value after the next significant bit transitions to a logic "0" value. In this situation, a binary "00000" is briefly applied to NAND gate 220, causing a glitch in count indicator C. Glitches such as these can cause confusion as to when to end the pulse generated by pulse generator 230.

It would be desirable to generate a glitchless pulse of known duration using minimal logic without resorting to the use of expensive testing equipment.

SUMMARY

Accordingly, a glitchless pulse generator is described that allows generating an accurate, glitchless pulse of a predetermined width. In one embodiment of the present invention, a latched counter which is clocked by a clock signal of known frequency is implemented in the configurable logic of a configurable logic chip (e.g. a Field Programmable Gate Array) and used to determine the duration of the pulse. A trigger signal coupled with the count signal from the latched counter provides the start and end commands for the pulse. As a result, the pulse generator is implemented using minimal logic, and therefore occupies minimal area on the configurable logic chip undergoing testing.

In another embodiment of the present invention, the trigger signal is first latched by the clock signal before coupling with the count signal to further reduce errors in the duration of the pulse. However, the reduction in errors comes at the expense of additional logic that occupies more space on the chip. The use of a simple glitchless pulse generator for chip testing obviates the need for the use of more expensive, all-purpose testing equipment for performing delay testing on chips.

The present invention will be more fully understood in view of the following description and drawings.

BRIEF DESCRIPTION OF THE DRAWINGS

Similar elements in Figures are labeled similarly.

DETAILED DESCRIPTION

A pulse having a duration of T seconds may be generated using a clock signal having a frequency of X MHz. In one embodiment, this clock signal is generated by a crystal oscillator. A number of clock cycles M of the clock signal occur during the duration T seconds of the pulse. That is:

$$M = X*T \qquad \text{Equation 1.}$$

where M is the number of clock cycles of the clock signal occurring during the pulse, X is the frequency of the clock signal, and T is the desired duration of the pulse. For example, with a desired pulse duration of 250 µs (T) and an oscillating clock pulse of frequency 66 MHz (X), 16500 (M) clock cycles of the oscillating clock pulse occur during the duration of the pulse.

Once the number of clock cycles M is found, a number N may be defined such that:

$$2^{N-1} < M < 2^N \qquad \text{Equation 2.}$$

where N is the number of bits required to count to the number M (i.e. the size of the counter used to count to M). Taking the base-2 log of Equation 2 results in:

$$\log_2(2^{N-1}) < \log_2(M) < \log_2(2^N) \ N-1 < \log_2(M) < N \qquad \text{Equation 3.}$$

In the example above, M=16500 clock cycles, which may be represented in binary as "100000001110100". In this example, N is 15, because $2^{N-1} = 2^{15-1} = 2^{14} = 16384$ which is less than 16500 and $2^N = 2^{15} = 32768$ which is greater than 16500. In the above binary representation of the number 16500, the least significant bit (LSB) (i.e. in the $2^0$ position) is a logic "0" and the most significant bit (MSB) (i.e. in the $2^{15}$ position) is a logic "1".

Once the number of bits N required to count the desired number of pulses has been found, an N-bit counter may be initialized to a number $2^N - M$, such that counting M clock cycles of the clock signal will result in having a count value equal to $2^N$ in the counter. This is explained in more detail below.

Figure 1:
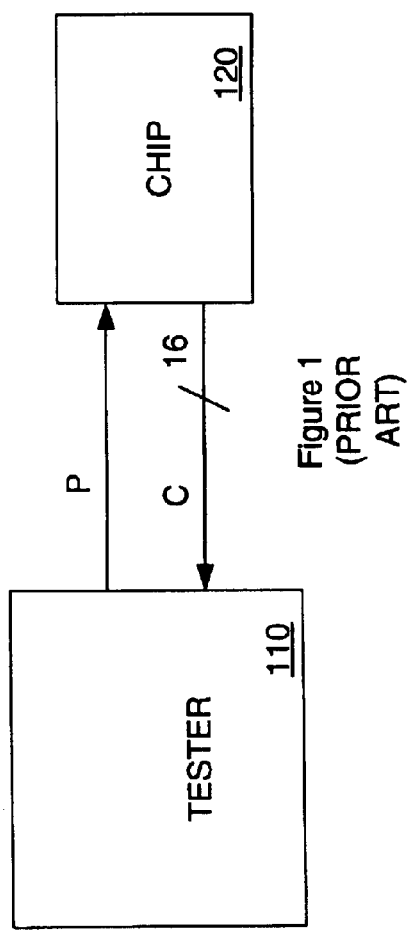
FIG. 1 is a block diagram of a conventional system for performing tests on a chip.
Figure 2:
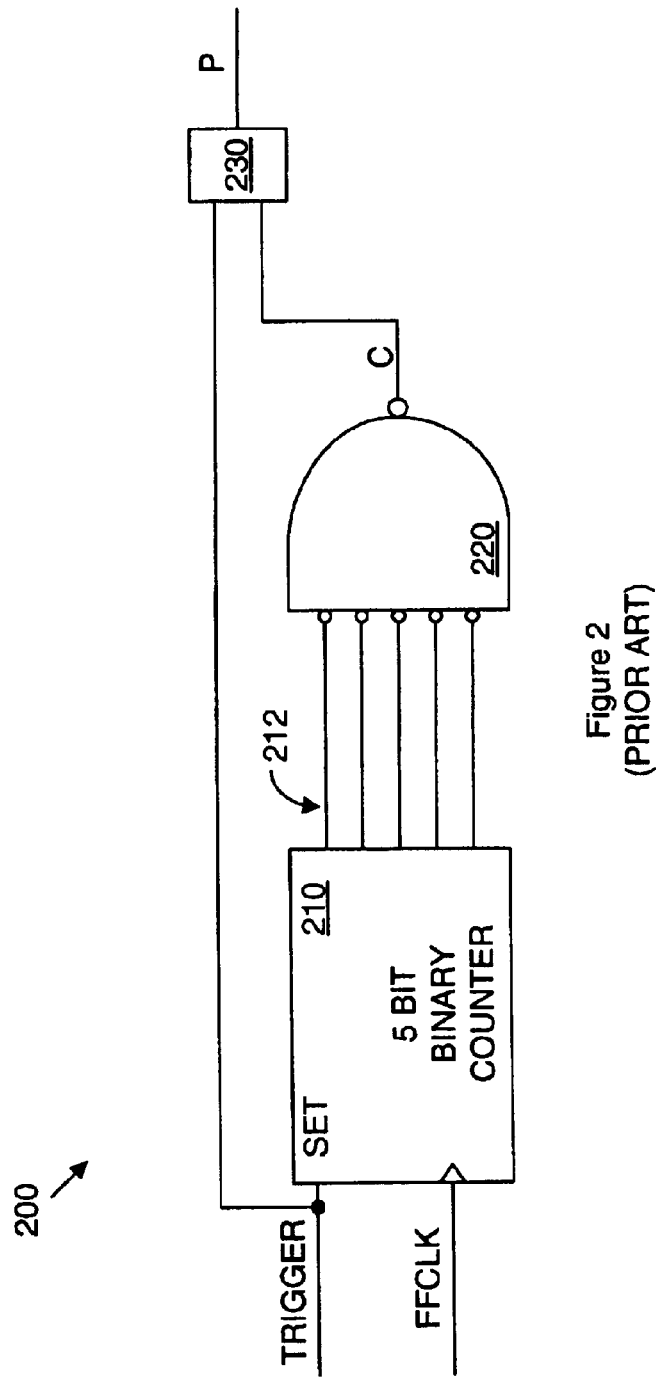
FIG. 2 is a block diagram of a conventional system for generating a pulse of a particular duration.
Figure 3A:
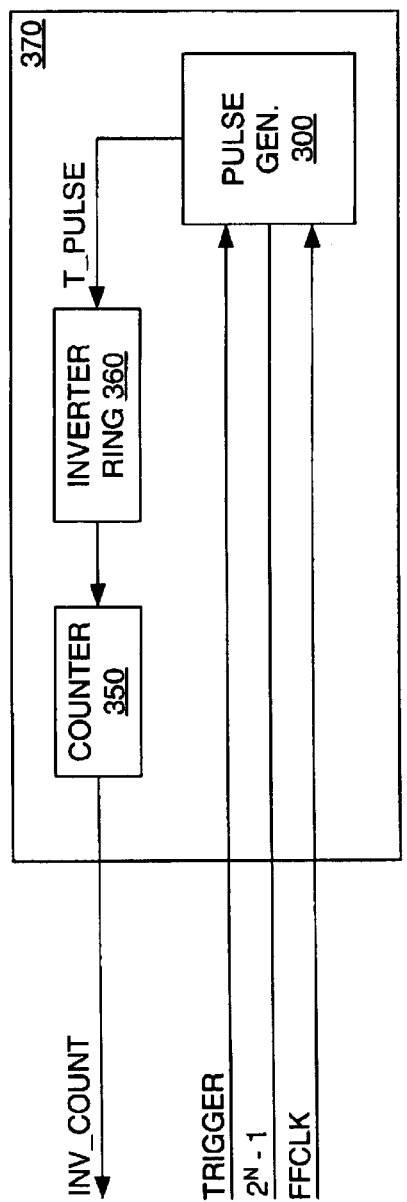
FIG. 3A is a block diagram of a silicon chip undergoing internal circuitry delay testing in accordance with one embodiment of the present invention.

FIG. 3A is a block diagram of a configurable logic chip undergoing internal circuitry delay testing in accordance with one embodiment of the present invention. A pulse generator 300, a counter 350, and an inverter ring 360 are implemented in the configurable logic on chip 370 prior to internal circuitry delay testing. After testing, the configurable logic used for pulse generator 300 can be reused for other logic functions. In this embodiment, a trigger signal TRIGGER and a clock signal FFCLK are applied to pulse generator 300 from an external source (not shown). The transition of trigger signal TRIGGER to a logic "1" value initializes N-bit binary counter 310 (FIG. 3B) in pulse generator 300 to a particular value (e.g. $2^N - M$). The de-assertion of trigger signal TRIGGER to a logic "0" value causes N-bit binary counter 310 to begin counting, as well as initiating the generation of a T length pulse, described in more detail below.

Pulse generator 300 applies T length pulse signal T_PULSE to inverter ring 360 as described above. In one embodiment, inverter ring 360 comprises a pair of cross coupled inverters. Inverter ring 360 oscillates in response to pulse signal T_PULSE. These oscillations are counted by counter 350, which provides an inverter ring count signal INV_COUNT to an output terminal of chip 370 which can be read by an external device (not shown). Once N-bit binary counter reaches a count of $2^N$, pulse generator 300 transitions pulse signal T_PULSE to a logic "0" value as described above, ending the T length pulse. Inverter ring 360 ceases oscillation in response to the end of the T length pulse. The number of oscillations of inverter ring 360 counted by counter 350 are provided to an external output (not shown) of chip 370 in this embodiment. The internal circuitry delay of chip 370 may be calculated from the duration T of the T_length pulse (see Equation 1) and the inverter ring count signal INV_COUNT.

Figure 3B:
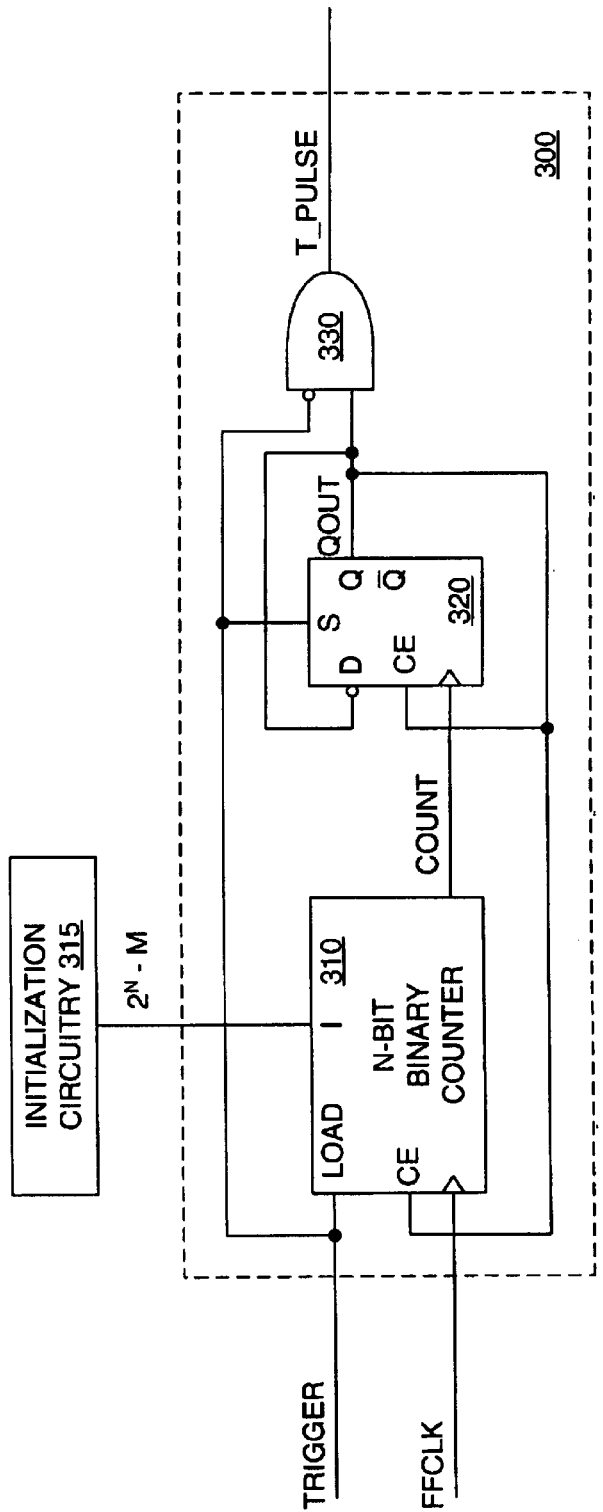
FIG. 3B is a block diagram of a pulse generator in accordance with one embodiment of the present invention.

FIG. 3B is a block diagram of a pulse generator 300 in accordance with one embodiment of the present invention. Pulse generator 300 includes a programmable N-bit binary counter 310 (e.g. a 5-bit binary counter), a flip-flop 320, and an AND logic gate 330. Initialization circuitry 315 provides an initialization value to N-bit binary counter 310. Pulse generator 300 is formed on a chip (not shown) undergoing testing. N-bit binary counter 310 may be programmed to increment the count a particular number M times, where M, as described above, is less than $2^N$. A clock terminal of N-bit binary counter 310 is coupled to receive a fixed frequency clock signal FFCLK. Clock signal FFCLK is a stable clock signal, e.g., from a crystal oscillator, and may be generated off of the chip undergoing testing. If N-bit binary counter 310 is rising edge triggered, the count of the N-bit binary counter 310 is incremented for each rising edge of clock signal FFCLK applied to the clock terminal. As a result, a variation in the frequency of clock signal FFCLK directly affects the duration of time between increments of the count signal of N-bit binary counter 310. Thus, the accuracy of clock signal FFCLK affects the overall accuracy of pulse generator 300. Other embodiments using these principles may, for example, be falling edge triggered.

A load terminal LOAD of N-bit binary counter 310 is coupled to receive a trigger signal TRIGGER. Asserting trigger signal TRIGGER, which may also be generated off chip, to a logic "1" value indicates that N-bit binary counter 310 should set the internal count value according to the value applied at initialization terminal I of N-bit binary counter 310. De-asserting trigger signal TRIGGER indicates when a pulse of length T seconds should be initiated. In other embodiments, a separate signal may be used to set the counter and to initiate the T length pulse. A clock enable terminal CE of N-bit binary counter 310 is coupled to receive an output signal QOUT from an output terminal Q of flip-flop 320. When a logic "1" value is applied at clock enable terminal CE of N-bit binary counter 310, N-bit binary counter 310 is enabled.

N-bit binary counter 310 is initialized to begin counting at a value of ($2^N - M$) provided by initialization circuitry 315. A transition to a logic "1" value of trigger signal TRIGGER causes N-bit binary counter 310 to set this initial value. A transition to a logic "0" value of trigger signal TRIGGER then causes N-bit binary counter 310 to begin counting, for example, rising edges of clock signal FFCLK applied at the clock terminal. As a result, after counting M rising edges of clock signal FFCLK, a value of ($2^N - M + M$) = $2^N$ is reached. When the value of $2^N$ is reached, the $2^{Nth}$ bit (i.e., the MSB) will change from a logic "0" value to a logic "1" value. This $2^{Nth}$ bit is provided at the output terminal of N-bit binary counter 310 as count signal COUNT. Therefore, the transition of count signal COUNT from a logic "0" to a logic "1" indicates that the value of $2^N$ has been reached by N-bit binary counter 310.

Set-terminal-S of flip-flop 320 is coupled to receive trigger signal TRIGGER. Flip-flop 320 forces output signal QOUT provided at output terminal Q to a logic "1" value when a logic "1" value is applied at the set terminal. As a result, when trigger signal TRIGGER transitions to a logic "1" value, initializing the count in N-bit binary counter 310, output signal QOUT provided at output terminal Q is also set to a logic "1" value. A logic "0" value of trigger signal TRIGGER applied at set terminal S causes flip-flop 320 to function normally. A data terminal D of flip-flop 320 is coupled to receive and invert output signal QOUT. In this configuration during normal enabled operation, output signal QOUT will oscillate between a logic "0" and a logic "1" value for each clock pulse (e.g., for each rising edge of the clock pulse) applied at the clock terminal.

However, the clock terminal of flip-flop 320 is coupled to receive count signal COUNT from the output terminal of N-bit binary counter 310. Thus, a transition to a logic "1" value of count signal COUNT will cause a flip-flop 320 to provide a logic "0" value output signal QOUT. Flip-flop 320 has a clock enable terminal also coupled to receive output signal QOUT. When output signal QOUT has a logic "1" value, flip-flop 320 is enabled to respond to count signal COUNT.

An AND logic gate 330 is coupled to receive trigger signal TRIGGER at an inverting first input terminal and output signal QOUT from flip-flop 320 at a second (non-inverting) input terminal. AND logic gate 330 provides a T length pulse signal T_PULSE at an output terminal. A logic "1" value of trigger signal TRIGGER applied at the inverted first input terminal of AND gate 330 causes a logic "0" value to be provided at the output terminal of AND gate 330. Additionally, as noted above, the transition to a logic "1" value of trigger signal TRIGGER causes the initialization of N-bit binary counter 310 to a value of $2^N-M$ and output signal QOUT of flip-flop 320 to a logic "1" value. When trigger signal TRIGGER transitions to a logic "0" value, the logic "0" value of trigger signal TRIGGER consequently applied at the inverted first input terminal AND gate 330 and the logic "1" value of output signal QOUT applied at the second input terminal causes AND gate 330 to provide a logic "1" value at the output terminal as pulse signal T_PULSE initiating the T length pulse.

Pulse signal T_PULSE remains as a logic "1" value until output signal QOUT transitions to a logic "0" value. When N-bit binary counter 310 has counted to a value of $2^N$, count signal COUNT transitions to a logic "1" value. The transition to a logic "1" value of count signal COUNT causes the logic "1" value applied to the data terminal D to be passed through as a logic "0" value to output terminal Q. This logic "0" at output terminal Q is applied to both the second input terminal of AND gate 330, causing pulse signal T_PULSE to transition to a logic "0" value, and disables the clock enable terminals of N-bit binary counter 310 and flip-flop 320. As a result, the T length pulse is ended.

N-bit binary counter 310 counts up to a value (e.g. $2^N$), rather than down to a value (e.g. 0). For example, in a 5-bit binary counter, $2^N-1=$"01111" and $2^N=$"10000". As a result, the final value to be counted is determined by the portion of the binary count value (the MSB) that changes least. Because the MSB of N-bit binary counter 310 only changes state once while counting up to $2^N$, no glitching occurs in the state of the MSB. As a result, no glitches occur in T length pulse signal T_PULSE. While the above circuits have been described with respect to synchronous operation, asynchronous operation may be obtained using principles similar to those described above.

Figure 3C:
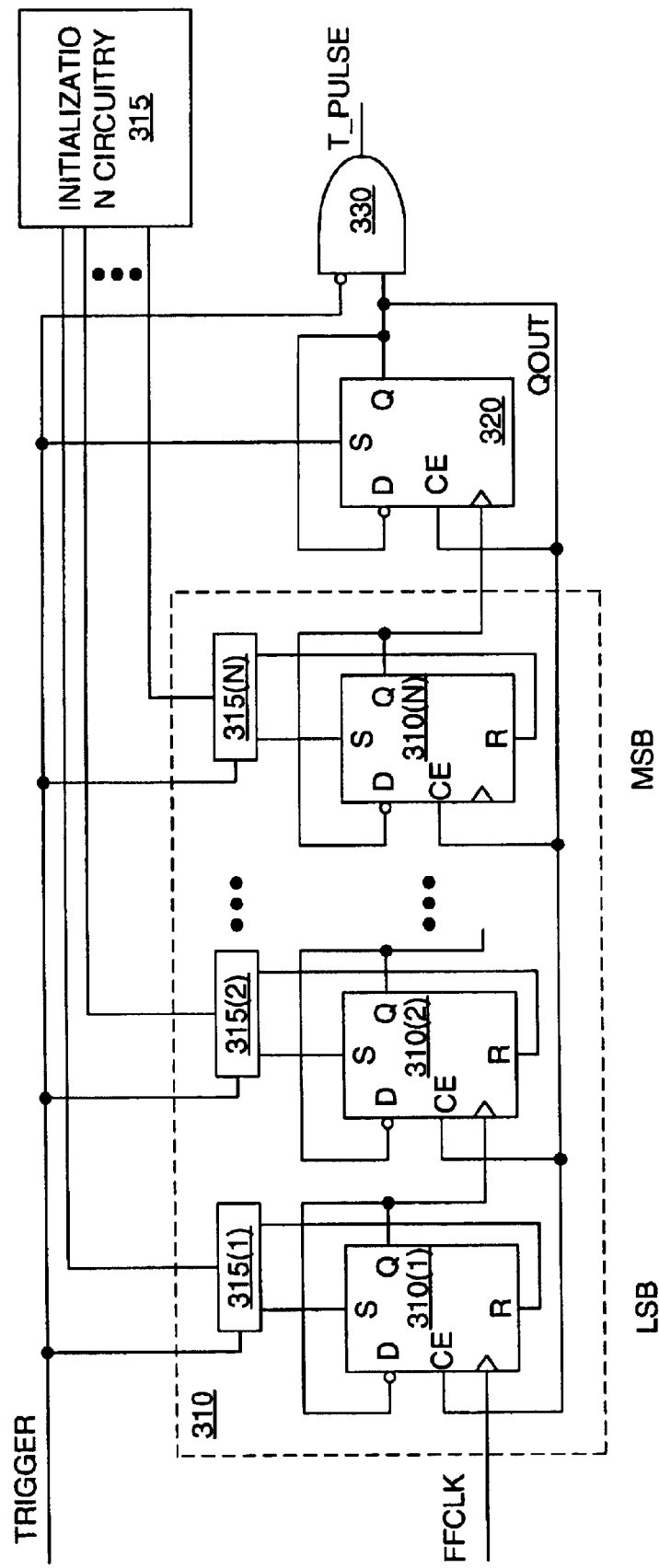
FIG. 3C is a particular implementation of the pulse generator of FIG. 3B in accordance with one embodiment of the present invention.

FIG. 3C is a particular implementation of N-bit binary counter 310 in pulse generator 300 in accordance with one embodiment of the present invention. N-bit binary counter 310 includes N flip-flops 310(1)–310(N). When implemented in programmable logic, the number of flip-flops N may be altered, altering the number $2^N$ to which N-bit binary counter 310 counts. Each of flip-flops 310(1)–310(N) receives output signal QOUT at a clock enable terminal CE. Either a set terminal S (which sets the output value Q of the flip-flop to a logic "1" value) or a reset terminal R (which resets the output value Q of the flip-flop to a logic "0" value) of each flip-flop 310(1)–310(N) is programmably coupled to receive trigger signal TRIGGER by initialization circuitry 315. In one embodiment, initialization circuitry 315 uses initialization memory cells 315(1)–315(N) to program which of set terminal S and reset terminal R for flip-flops 310(1)–310(N) is coupled to receive trigger signal TRIGGER. As shown, both set terminal S and reset terminal R are active high. Other embodiments may have one or both of these input terminals active low. If set terminal S (active high) is coupled to receive trigger signal TRIGGER by initialization circuitry 315, then a transition to a logic "1" value of trigger signal TRIGGER will provide a logic "1" value at output terminal Q of that flip-flop. On the other hand, if reset terminal R (active high) is coupled to receive trigger signal TRIGGER by initialization circuitry 315, then a transition to a logic "0" "1" value of trigger signal TRIGGER will provide a logic "0" value at output terminal Q of that flip-flop.

For example, for a value of $(2^N-M)=3$, the binary representation of the number 3 using four bits is "0011". To initialize a 4-bit counter (having 4 flip-flops) to a value of three, the first and second flip-flops (representing the two LSBs) would have a set terminal S coupled to receive trigger signal TRIGGER in which a transition to a logic "1" value of trigger signal TRIGGER applied to the set terminal S causes a logic "1" value to be provided at the associated output terminal Q. The third and fourth flip-flops (representing the two MSBs) would have a reset terminal R coupled to receive trigger signal TRIGGER in which a transition to a logic "1" value of trigger signal TRIGGER applied to the reset terminal R causes a logic "0" value to be provided at the associated output terminal Q providing the 4-bit counter with an initial value of 3. The $N^{th}$ flip-flip will always have reset terminal R coupled to receive trigger signal TRIGGER when counting to $2^N$. Thus, the counter in this example counts from an initial value of 3 to a final value of $(2^N-M)=8$, as described above. In this manner, the initial value of N-bit counter 310 may also be set to any value $2^N-M$. Each of flip-flops 310(1)–310(N) additionally receives their own output signal, provided at output terminal Q, invertedly at a data terminal D. Other embodiments use data terminals D of flip-flops 310(1)–310(N) to initialize N-bit binary counter 310.

A first flip-flop 310(1) receives a clock signal FFCLK at a clock terminal. When output signal QOUT enables flip-flop 310(1), each rising edge of clock signal FFCLK toggles the logic value provided at output terminal Q of flip-flop 310(1). Thus, if the last value provided at output terminal Q of flip-flop 310(1) is a logic "0" value, then the next value provided at output terminal Q will be a logic "1" value. In this way, each rising edge of clock signal FFCLK causes the least significant bit (LSB) of the number N counted by N-bit binary counter to change.

A second flip-flop 310(2) receives a clock signal from output terminal Q of flip-flop 310(1). Thus, each time the value provided at output terminal Q of flip-flop 310(1) transitions to a logic "1" value, flip-flop 310(2) toggles the value provided at output terminal Q of flip-flop 310(2). In this way, flip-flop 310(2) is clocked at half the rate that flip-flop 310(1) is clocked. In other words, flip-flop 310(2) toggles the value provided at output terminal Q every other rising edge of clock signal FFCLK.

The value provided at each output terminal Q is applied to the clock terminal of the next flip-flop as described above. At the most significant bit (MSB) of the N-bit binary counter, a flip-flop 310(N) receives a clock signal from output terminal Q of flip-flop 310(N−1) (not shown). Thus, each time the value provided at output terminal Q of flip-flop 310(N−1) transitions to a logic "1" value, flip-flop 310(N) toggles the value provided at output terminal Q of flip-flop 310(N). In this way, flip-flop 310(N) is clocked at ($\frac{1}{2}^{N-1}$) the frequency of clock signal FFCLK, which is half the rate that flip-flop 310(N−1) is clocked. Thus, the value provided at output terminal Q of flip-flop 310(N) transitions to a logic "1" value when N rising edges of clock signal FFCLK have been counted. While the present embodiment has been described as implemented in the programmable logic of such devices as Field Programmable Gate Arrays (FPGAs), the principles of this invention may be used to implement the present invention on other types of chips requiring a pulse having an accurate duration.

Figure 3D:
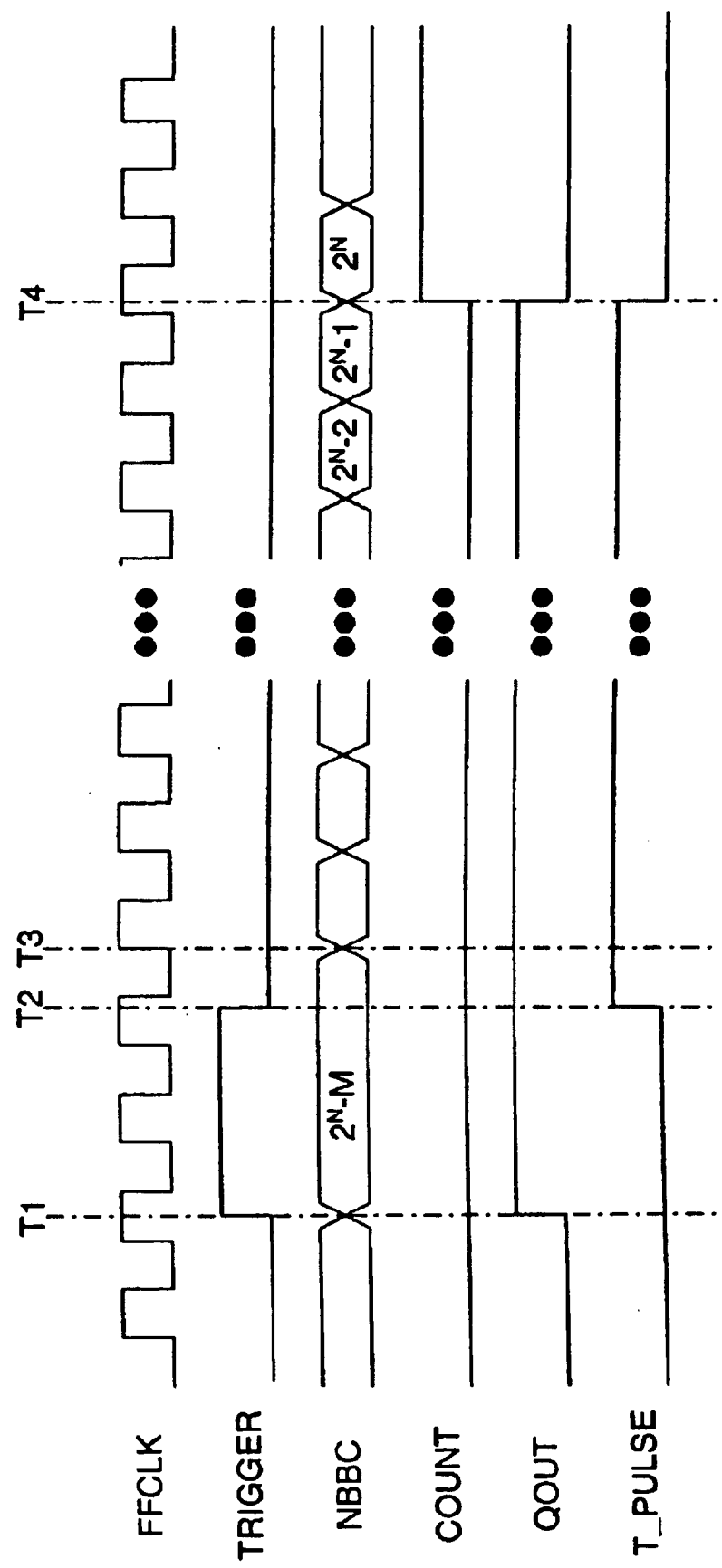
FIG. 3D is a timing diagram of the operation of the pulse generator of FIG. 3B.

FIG. 3D is a timing diagram of the operation of pulse generator 300. As shown, clock signal FFCLK is a regular square wave clock signal, such as from a crystal oscillator. FIG. 3D shows no delays for the purposes of conciseness and clarity. Trigger signal TRIGGER transitions to a logic "1" value at time T1 to configure pulse generator 300 (FIG. 3B). The transition to a logic "1" value of trigger signal TRIGGER causes N-bit binary counter 310 to set to an initial count value of $2^N-M$. Additionally, in response to the transition to a logic "1" value of trigger signal TRIGGER applied at set terminal S of flip-flop 320 (FIG. 3B), output signal QOUT of flip-flop 320 (FIG. 3B) is set to a logic "1" value at time T1. The logic "1" value of output signal QOUT enables the clock enable terminals CE of N-bit binary counter 310 and flip-flop 320 (FIG. 3B).

The T length pulse T_PULSE is the logical AND of the inverse of trigger signal TRIGGER and output signal QOUT (i.e., a logic "1" value). Thus, in response to the transition of trigger signal TRIGGER to a logic "0" value at time T2, the T length pulse T_PULSE transitions to a logic "1" value. Upon reaching the rising edge of clock signal FFCLK at time T3, N-bit binary counter 310 (FIG. 3B) begins counting from the initialized value of $2^N-M$. This count is represented as the count value NBBC in FIG. 3D.

The count value NBBC increments by one for each rising edge of clock signal FFCLK. When N-bit binary counter 310 (FIG. 3B) has counted to a value of $2^N$ (therefore counting M clock pulses of clock signal FFCLK), at time T4 count signal COUNT from N-bit binary counter 310 transitions to a logic "1" value. In response to this transition to a logic "1" value of the count signal COUNT, a logic "0" (i.e., the inverse of output signal QOUT) is passed through flip-flop 320 (FIG. 3B) as the new output signal QOUT. Thus, at time T4, output signal QOUT transitions to a logic "0" value. In response to this logic "0" value of output signal QOUT (applied at the second input terminal of AND gate 330), the T length pulse T_PULSE transitions to a logic "0" value at time T4.

As described with respect to FIG. 3D. The T length pulse T_PULSE may longer than T seconds by the amount of time between time T2 and T3. Because this error represents the difference in time between the transition of trigger signal TRIGGER to a logic "0" value and the next rising edge of clock signal FFCLK, this error will be less than 1/M. Thus, if the length of a clock cycle of clock signal FFCLK is small with respect to the total length T of the T length clock pulse, this error is negligible. However, if more accuracy is required in generating the T length clock pulse, an additional circuit may be added to eliminate the error.

Figure 4A:
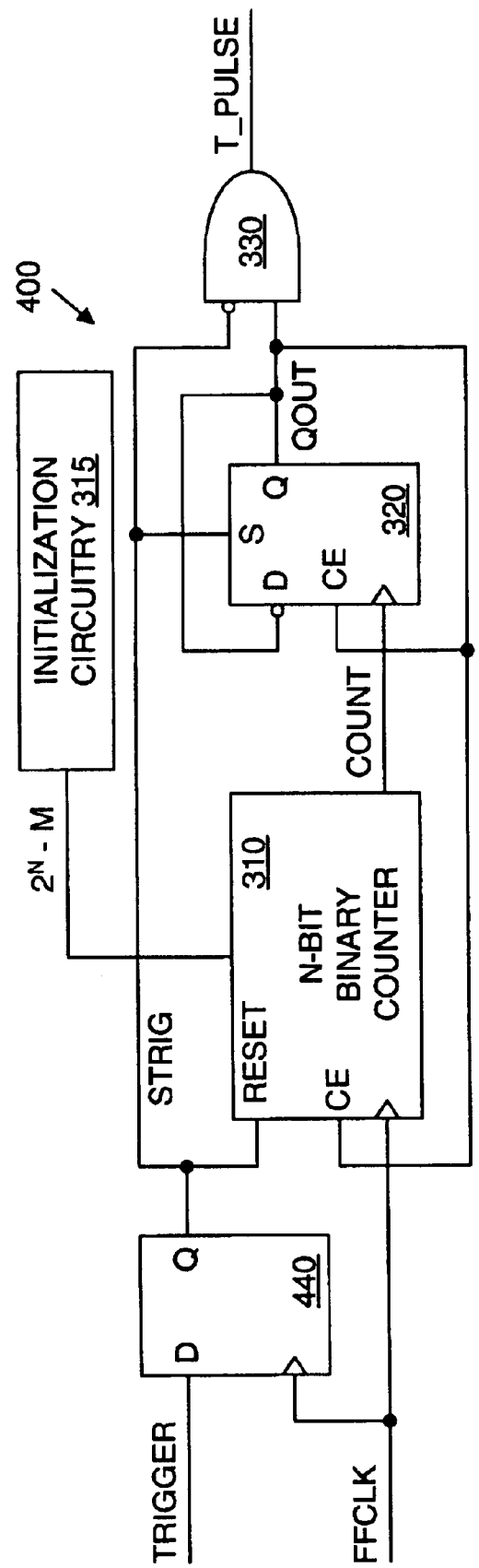
FIG. 4A is a block diagram of a latched pulse generator in accordance with another embodiment of the present invention.

FIG. 4A is a block diagram of a latched pulse generator 400 in accordance with one embodiment of the present invention. Similar elements in FIGS. 3A and 4A are labeled similarly. N-bit binary counter 310, flip-flop 320, AND gate 330, and initialization logic 315 are described above. The addition of D-type flip-flop 440 synchronizes trigger signal TRIGGER with clock signal FFCLK, such that the synchronized trigger signal STRIG transitions with the first rising edge of clock signal FFCLK after the transition of trigger signal TRIGGER.

Figure 4B:
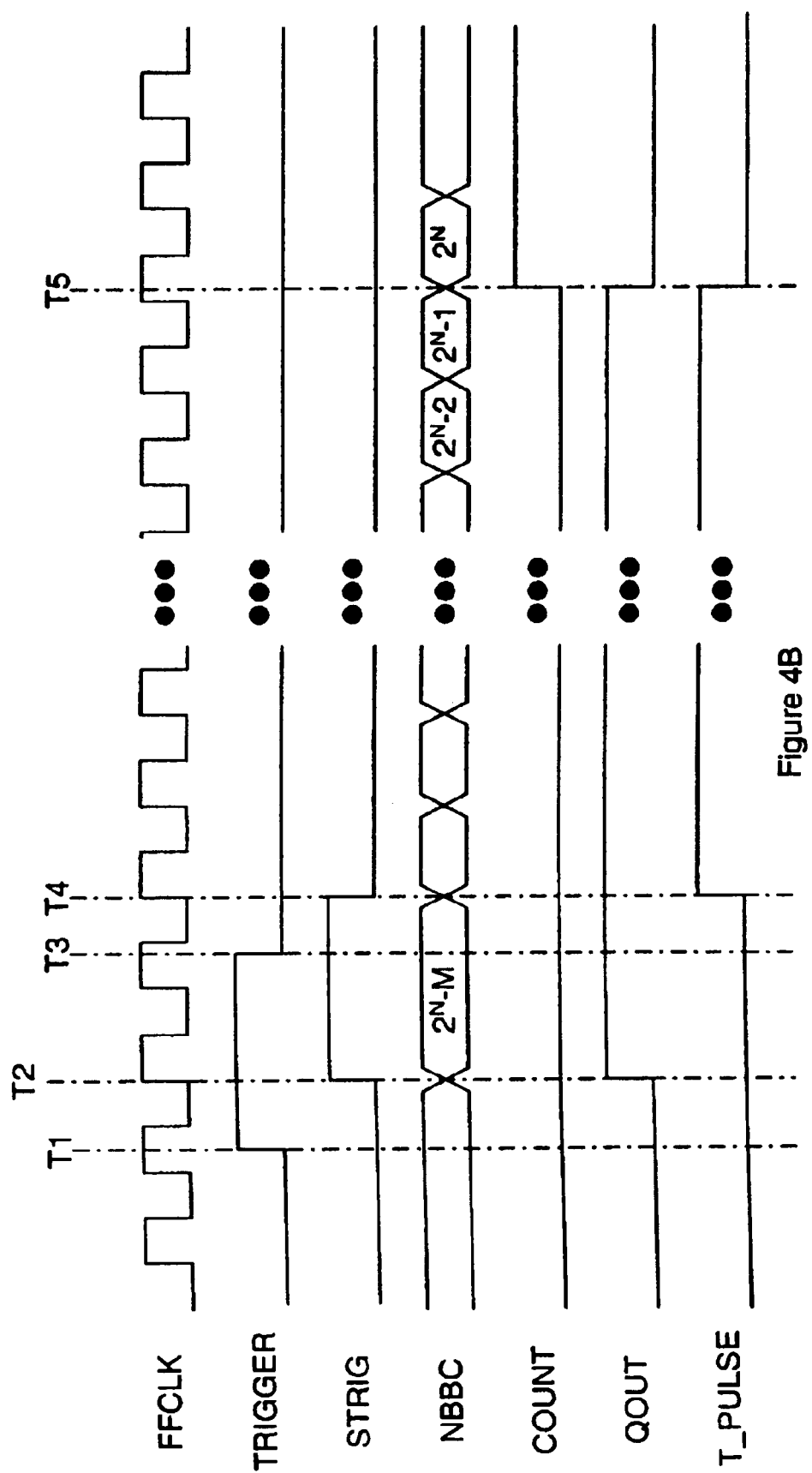
FIG. 4B is a timing diagram of the operation of the latched pulse generator of FIG. 4A.

FIG. 4B is a timing diagram of the operation of pulse counter 400. The timing diagram is similar to the timing diagram of FIG. 3D, except that count signal COUNT, output signal QOUT, T length pulse T_PULSE, and N-bit binary counter count signal NBBC respond to a synchronized trigger signal STRIG, rather than directly responding to trigger signal TRIGGER. Thus, after trigger signal TRIGGER transitions to a logic "1" value at time T1, synchronized trigger signal STRIG transitions to a logic "1" value with the rising edge of clock signal FFCLK at time T2. Output signal QOUT responds to the transition of the synchronized trigger signal STRIG at time T2. When trigger signal TRIGGER transitions to a logic "0" value at time T3, synchronized trigger signal STRIG responds at the rising edge of clock signal FFCLK at time T4, transitioning to a logic "0" value. Again, the count of N-bit binary counter (signal NBBC) begins in response to the falling synchronized trigger signal STRIG, as does the T length pulse signal T_PULSE.

In the various embodiments of this invention, novel structures and methods have been described to generate an accurate glitchless pulse as well as to further improve the accuracy of the length of the pulse. Using flip-flop coupled with a two input AND gate in place of large, multi-input AND gate in accordance with an embodiment of the present invention, the tendency for glitches exemplified in the conventional method can be avoided. Additionally, utilizing such common and relatively inexpensive elements in accordance with an embodiment of the present invention, a T length pulse may be glitchlessly, accurately generated while obviating the need for the use of a large, expensive test bench. The various embodiments of the structures and methods of this invention that are described above are illustrative only of the principles of this invention and are not intended to limit the scope of the invention to the particular embodiments described. For example, in view of this disclosure, those skilled in the art can define other circuit elements that may be grouped together to function similarly to the embodiments described, such as NAND gates, latches, clock generators, different types of counters, and so forth, and use these alternative features to create a method or system according to the principles of this invention. Thus, the invention is limited only by the following claims.

What is claimed is:

1. A glitchless pulse generator implemented on a configurable logic device, comprising:
    a counter having a programmable number of stages, wherein the counter is configured to count from a value of $2^N-M$ to a value of $2^N$;
    a flip-flop coupled to receive a count signal from the counter; and
    a logic gate coupled to receive an output signal from the flip-flop and a trigger signal, and coupled to provide a pulse signal; wherein M represents a number of clock cycles associated with a desired duration of the pulse signal, and wherein N represents a number of bits required to count to M.

2. A glitchless pulse generator implemented on a configurable logic device, comprising:
   a counter configured to count from a value of $2^N-M$ to a value of $2^N$;
   a flip-flop coupled to receive a count signal from the counter; and
   a logic gate coupled to receive an output signal from the flip-flop and a trigger signal, and coupled to provide a pulse signal, where the counter is configured to receive the trigger signal, and where the trigger signal indicates a time for the counter to begin counting, wherein M represents a number of clock cycles associated with a desired duration of the pulse signal, and wherein N represents a number of bits required to count to M.

3. The glitchless pulse generator of claim 2, where a duration of the pulse signal is determined by the length of a count from the counter.

4. The glitchless pulse generator of claim 1, where the count signal clocks the flip-flop.

5. The glitchless pulse generator of claim 1, further comprising a clock signal, where the counter counts the number of cycles of the clock signal.

6. The glitchless pulse generator of claim 5, further comprising a synchronizing logic device for providing the trigger signal by latching an asynchronous trigger signal in response to the clock signal.

7. The glitchless pulse generator of claim 1, where the configurable logic device is a Field Programmable Gate Array.

8. The glitchless pulse generator of claim 1, further comprising initialization circuitry for setting an initial count in the counter.

9. A method of generating a glitchless pulse, comprising:
   initiating a beginning of the glitchless pulse;
   configuring a counter from programmable resources of a configurable logic device, the counter having a programmable number of stages;
   using the counter to count from a value of $2^N-M$ to a value of $2^N$ a first number M of clock cycles of a clock signal occurring after receiving a trigger signal, producing a count signal;
   changing a first state with the count signal when a particular number is reached by the count signal;
   initiating an end of the glitchless pulse after the first state change, wherein M represents a number of clock cycles associated with a desired duration of the glitchless pulse, and wherein N represents a number of bits required to count to M.

10. The method of claim 9, further comprising synchronizing the trigger signal with the clock signal.

11. The method of claim 9, further comprising initializing the count signal to an initial number.

12. The method of claim 9, further comprising providing the glitchless pulse to a location external to the configurable logic device.

13. A system for generating a glitchless pulse, comprising:
    means for initiating a beginning of the glitchless pulse;
    means for configuring a counter from programmable resources of a configurable logic device, the counter having a programmable number of stages;
    means for causing the counter to count from a value of $2^N-M$ to a value of $2^N$ a first number M of clock cycles of a clock signal occurring after receiving a trigger signal, producing a count signal;
    means for changing the count signal to a first state when a particular number is reached by the count signal;
    means for initiating an end of the glitchless pulse after the count signal changes to the first state, wherein M represents a number of clock cycles associated with a desired duration of the glitchless pulse, and wherein N represents a number of bits required to count to M.

14. The system of claim 13, further comprising means for synchronizing the trigger signal with the clock signal.

15. The system of claim 13, further comprising means for initializing the count signal to an initial number.

16. The system of claim 13, where the system for generating the glitchless pulse is implemented on a Field Programmable Gate Array.

17. A method of forming a glitchless pulse generator on a configurable logic device, comprising:
    forming a counter in configurable logic of the configurable logic device for counting from a value of $2^N-M$ to a value of $2^N$, where the counter is coupled to receive a trigger signal and a clock signal;
    forming a first latch in the configurable logic, where the first latch is coupled to receive a most significant bit of a count of the counter; and
    forming a logic gate in the configurable logic, where the logic gate is configured to form a pulse in response to the trigger signal and an output signal from the first latch, wherein M represents a number of clock cycles associated with a desired duration of the pulse, and wherein N represents a number of bits required to count to M.

18. The method of claim 17, further comprising forming a second latch in the configurable logic, where the second latch is configured to provide the trigger signal by latching an asynchronous trigger signal in response to the clock signal.

19. The method of claim 17, where the counter is initialized to an initial number.

20. A glitchless pulse generator implemented on a configurable logic device, comprising:
    means for generating a trigger signal that identifies the beginning of a pulse;
    a counter having a programmable number of stages, wherein the counter is configured to count from a value of $2^N-M$ to a value of $2^N$ in response to a clock signal, wherein M is an integer that represents a number of cycles of the clock signal associated with a desired duration of the pulse;
    a flip-flop configured to provide an output signal having a first logic state in response to the trigger signal, and configured to provide an output signal having a second logic state in response to a transition of a most significant bit of the counter; and
    a logic gate coupled to receive the trigger signal and the output signal provided by the flip-flop, wherein the logic gate provides a pulse having a duration approximately equal to M cycles of the clock signal in response to the trigger signal and the output signal provided by the flip-flop, wherein N represents a number of bits required to count to M.

21. The glitchless pulse generator of claim 20, where the most significant bit of the counter is coupled to a clock terminal of the flip-flop.

22. The glitchless pulse generator of claim 20, further comprising a synchronizing logic device for providing the trigger signal by latching an asynchronous trigger signal in response to the clock signal.

23. The glitchless pulse generator of claim 20, where the configurable logic device is a Field Programmable Gate Array.

24. The glitchless pulse generator of claim 20, further comprising initialization circuitry configured to load a count value of $2^N-M$ into the counter in response to the trigger signal.

25. The glitchless pulse generator of claim 20, wherein N is selected such that $2^N>M>2^{N-1}$.

26. The glitchless pulse generator of claim 20, wherein the counter comprises programmable resources of the configurable logic device.

27. The glitchless pulse generator of claim 20, further comprising a synchronizing logic device for providing the trigger signal by latching an asynchronous trigger signal in response to the clock signal.

28. A method of generating a glitchless pulse, comprising:
  generating a trigger signal that identifies the beginning of a pulse;
  configuring a counter from programmable resources of a configurable logic device, the counter having a programmable number of stages;
  using the counter to count from a value of $2^N-M$ to a value of $2^N$ in response to a clock signal, wherein M is an integer that represents a number of cycles of the clock signal associated with a desired duration of the pulse;
  activating the pulse in response to a transition of the trigger signal; and
  deactivating the pulse in response to a transition of a most significant bit of the counter from a first logic state to a second logic state, wherein N represents a number of bits required to count to M.

29. The method of claim 29, further comprising synchronizing the trigger signal with the clock signal.

30. The method of claim 28, further comprising selecting the number of stages, such that $2^N>M>2^{N-1}$.

31. The method of claim 28, further comprising providing the pulse to a location external to the configurable logic device.

32. A system for generating a glitchless pulse, comprising:
  means for generating a trigger signal that identifies the beginning of a pulse;
  means for configuring a counter from programmable resources of a configurable logic device, the counter having a programmable number of stages;
  means for causing the counter to count from a value of $2^N-M$ to a value of $2^N$ in response to a clock signal, wherein M is an integer that represents a number of cycles of the clock signal associated with a desired duration of the pulse;
  means for activating the pulse in response to a transition of the trigger signal; and
  means for deactivating the pulse in response to a transition of a most significant bit of the counter from a first logic state to a second logic state, wherein N represents a number of bits required to count to M.

33. The system of claim 32, further comprising means for synchronizing the trigger signal with the clock signal.

34. The system of claim 32, further comprising means for selecting the number of stages such that $2^N>M>2^{N-1}$.

35. The system of claim 32, where the system for generating the pulse is implemented on a Field Programmable Gate Array.

* * * * *